United States Patent
Wang et al.

(10) Patent No.: US 11,158,738 B2
(45) Date of Patent: Oct. 26, 2021

(54) METHOD OF FORMING ISOLATION DIELECTRICS FOR STACKED FIELD EFFECT TRANSISTORS (FETS)

(71) Applicant: Samsung Electronics Co., Ltd., Gyeonggi-do (KR)

(72) Inventors: Wei-E Wang, Austin, TX (US); Mark Rodder, Dallas, TX (US); Vassilios Gerousis, Georgetown, TX (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/548,209

(22) Filed: Aug. 22, 2019

(65) Prior Publication Data

US 2020/0403097 A1    Dec. 24, 2020

Related U.S. Application Data

(60) Provisional application No. 62/863,062, filed on Jun. 18, 2019.

(51) Int. Cl.
*H01L 29/78* (2006.01)
*H01L 27/12* (2006.01)
*H01L 29/786* (2006.01)
*H01L 29/66* (2006.01)

(52) U.S. Cl.
CPC ...... *H01L 29/7842* (2013.01); *H01L 27/1203* (2013.01); *H01L 29/78603* (2013.01); *H01L 29/78618* (2013.01); *H01L 29/78684* (2013.01); *H01L 29/66636* (2013.01)

(58) Field of Classification Search
CPC .......... H01L 29/7842; H01L 29/78603; H01L 29/78618; H01L 29/78684; H01L 29/66636; H01L 27/1203
See application file for complete search history.

(56) References Cited

U.S. PATENT DOCUMENTS

| 7,041,576 | B2* | 5/2006 | Pozder | H01L 21/8221 257/E21.505 |
|---|---|---|---|---|
| 10,090,193 | B1 | 10/2018 | Chanemougame et al. | |
| 10,170,304 | B1 | 1/2019 | Kwon et al. | |
| 2007/0096263 | A1* | 5/2007 | Furukawa | H01L 21/76898 257/621 |
| 2009/0208725 | A1 | 8/2009 | Bailey et al. | |
| 2011/0193197 | A1* | 8/2011 | Farooq | H01L 23/585 257/618 |
| 2012/0187530 | A1* | 7/2012 | Zhang | H01L 21/76898 257/531 |

(Continued)

OTHER PUBLICATIONS

Cressler, John D., "SiGe and Si Strained-Layer Epitaxy for Silicon Heterostructure Devices", Copyright 2008 Taylor & Francis Group, LLC, pp. 252.

(Continued)

*Primary Examiner* — Peniel M Gumedzoe
(74) *Attorney, Agent, or Firm* — The Farrell Law Firm, P.C.

(57) ABSTRACT

A method of forming a stacked field effect transistor (FET) circuit is provided. The method includes providing a first wafer and a second wafer, forming a first dielectric layer on a surface of the first wafer, forming a second dielectric layer on a surface of the second wafer, and bonding the first wafer to the second wafer at the first dielectric layer and the second dielectric layer.

14 Claims, 7 Drawing Sheets

(56) References Cited

U.S. PATENT DOCUMENTS

| | | | |
|---|---|---|---|
| 2015/0083999 | A1 | 3/2015 | Cheng et al. |
| 2016/0111513 | A1 | 4/2016 | Liu et al. |
| 2017/0040209 | A1* | 2/2017 | Wang ............... H01L 21/31105 |
| 2018/0219064 | A1 | 8/2018 | Cheng et al. |
| 2018/0366597 | A1 | 12/2018 | Carlson et al. |
| 2020/0098756 | A1* | 3/2020 | Lilak ................ H01L 29/66545 |

OTHER PUBLICATIONS

Schuddinck, Ryckaert J. et al., "The Complementary FET (CFET) for CMOS scaling beyond N3", . . . 2018 Symposium on VLSI Technology Digest of Technical Papers, Copyright 2018 IEEE, pp. 141-142.

Paul, Douglas J., "Si/SiGe heterostructures: from material and physics to devices and circuits", Sep. 15, 2004, Institute of Physics Publishing, Semiconductor . . . Science and Technology, Copyright 2004 IOP Publishing Ltd., pp. 35.

Destefanis V., et al., "HCI Selective Etching of Si1-xGex versus Si for Silicon on Nothing and Multi Gate Devices", ECS Transactions, 16 (10) 427-438 (2008), . . . Copyright The Electrochemical Society, pp. 12.

Loubet, Nicolas et al., "Selective etching of Si1-xGeX versus Si with gaseous HCl for the formation of advanced CMOS devices", Thin Solid Films 517 (2008) 93-97, . . . Copyright 2008 Published by Elsevier B.V., pp. 5.

Czornomaz, L. et al., "Co-integration of InGaAs n- and SiGe p-MOSFETs into digital CMOS circuits using hybrid dual-channel ETXOI subtrates", Copyright 2013 IEEE, pp. 4.

Voncken, M.M.A.J. et al., "Multiple release layer study of the instrinsic lateral etch rate of the epitaxial lift-off process", Applied Physics A 79, 1801-1807 (2004), pp. 9.

Bruel, M. et al., "®'Smart Cut' : A Promising New SOI Material Technology", 178 Proceedings 1995 IEEE International SOI Conference, Oct. 1995, pp. 2.

Nayak, D. K. et al., "Wet oxidation of GeSi strained layers by rapid thermal processing", Applied Physics Letters 57, 369 (1990), pp. 4.

Aubin, J. et al., "Epitaxial growth of Si and SiGe at temperatures lower than 500° C. with disilane and germane", Thin Solid Films 602 (2016) 36-42, . . . Copyright 2015 Elsevier B.V., pp. 7.

Vincent, B. et al., "Low temperature Si homo-epitaxy by reduced pressure chemical vapor deposition using dichlorosilane, silane and trisilane", . . . Journal of Crystal Growth 312 (2010) 2671-2676, Copyright 2010 Elsevier B.V., pp. 6.

Cheng, K. et al., "High Performance Extremely Thin SOI (ETSOI) Hybrid CMOS with Si Channel NFET and Strained SiGe Channel PFET", Copyright 2012 IEEE, pp. 4.

Moriceau, H. et al., "Smart Cut™: Review on an attractive process for innovative substrate elaboration", Nuclear Instruments and Methods in Physics Research B 277 (2012) . . . 84-92, Copyright 2012 Elsevier B.V., pp. 9.

Zechner, Christoph et al., "Silicon germanium interdiffusion in SiGe device fabrication: A Calibrated TCAD model", Materials Science in Semiconductor Processing 42 (2016) . . . 230-234, Copyright 2015 Elsevier Ltd., pp. 5.

George, Steven M., "Atomic Layer Deposition: An Overview", Chem. Rev. 2010, 111-131, Copyright 2010 American Chemical Society, pp. 21.

* cited by examiner

METHOD OF FORMING ISOLATION DIELECTRICS FOR STACKED FIELD EFFECT TRANSISTORS (FETS)

PRIORITY

This application is based on and claims priority under 35 U.S.C. § 119(e) to a U.S. Provisional patent application filed on Jun. 18, 2019 in the United States Patent and Trademark Office and assigned Ser. No. 62/863,062, the entire contents of which are incorporated herein by reference.

FIELD

The present disclosure is generally related to forming stacked field effect transistor (FET) circuits.

BACKGROUND

To extend transistor scaling beyond 3 nm, several proposals are being considered, including vertical FETs (vFETs) and stacked FETs. In the case of vFETs, the channel stands vertical to the wafer. The latter, however, proposed to have one FET stacking on top the other (e.g., an nFET device stacked directly on top of a pFET (i.e., a complementary stacked FET (cFET))). In some cases, it is also possible to stack one unipolar FET to be formed on top of the other with the same polarity (e.g., an n-type FET (nFET) on an nFET or a p-type FET (pFET) on a pFET, (i.e., a unipolar-stacked FET)). In addition, it is desirable to have these FETs formed with nanosheets (or similar geometry) for improving the drive currents and with good gate control with a gate-all-around structure.

However, forming stacked FETs as described above is extremely complex and challenging due to the multiple nanosheets required. Thin channels (e.g., nanosheets), as required for good electrostatic control at short channel lengths, render large variations of thickness (due to imperfect selective etching) and can result in portions of the sheet being thicker than a target thickness, contributing to a loss of electrostatic control and a consequently degradation of performance (higher required $V_t$ at a given $I_{off}$). If electrostatics are sufficient, it is desirable to have as-wide-as possible nanosheets, ideally spanning the entire available cell height. Introducing breaks in nanosheets (in order to make the width of the individual stacks smaller and more amenable to processing (e.g. undercut of sacrificial layers without affecting thickness of the conduction layers in the nanosheet FET stack)) results in increased contribution to parasitic capacitance. The space between the sheets adds a parasitic ground component, which is detrimental to circuit performance. Therefore, thin, as-wide-as-possible nanosheets compatible with electrostatics and precisely controlled nanosheets are essential for optimal performance.

There are additional requirements before realizing the desired stacked FETs, such as isolation dielectrics separating the top and the bottom FETs.

SUMMARY

According to one embodiment, a method is provided. The method includes providing a first wafer and a second wafer, forming a first dielectric layer on a surface of the first wafer, forming a second dielectric layer on a surface of the second wafer, and bonding the first wafer to the second wafer at the first dielectric layer and the second dielectric layer.

According to one embodiment, a stacked FET circuit is provided. The circuit includes a first wafer including a first dielectric layer formed on a surface of the first wafer and a second wafer including a second dielectric layer formed on a surface of the second wafer. The first wafer and the second wafer are bonded at the first dielectric layer and the second dielectric layer.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

There are at least two key requirements for the desired stacked FETs, such as multi-horizontal nanosheet FETs, from the materials and structural perspectives with respect to the isolation dielectrics of interest. The first requirement is to have channel materials defect-free. The second requirement is that the shape of nanosheet must be tightly controlled (i.e., as much rectangular as possible) to achieve low deviation from the target performance and/or electrostatic control. Deviation from the rectangular shape for channel and the vertical spacing between them, such as an oval shape resulted from a low selectivity etch, tends to render high $V_t$ variability and/or lower electrostatics control.

Current state-of-art nanosheet fabrication relies heavily on the epitaxial growth of the desired nanosheet layers comprehending the isolation dielectrics is formed with Si/SiGex/Si/SiGex/SiGey/SiGex/Si/SiGex . . . /Si stack. In this case, SiGex are the dummy layers (assuming Si are the channels) to be replaced by a gate stack (IL/dielectric/metal gate) such as with a replacement metal gate (RMG) process sequence in the subsequent device formation flow. SiGey on the other hand is the sacrificial layer dedicated for the isolation dielectric (iso-D) formation. It is worth noting that germanium content of SiGey may be greater than that of SiGex (i.e., y>x) since they have to be etched away (i.e., against the layers (i.e., SiGex beneath and above)).

In this scheme, there are two main issues. First, insertion of a high germanium content SiGey layer may cause epitaxial (EPI) defects for the designated Si/SiGe stack. Secondly, a high selectivity ratio requirement ($SR_{y-x}$; selective etching SiGey against SiGex) is desired to maintain the integrity of SiGex. The two issues regard higher EPI defectivity and higher device variability due to loss of SiGex integrity.

Figure 1:
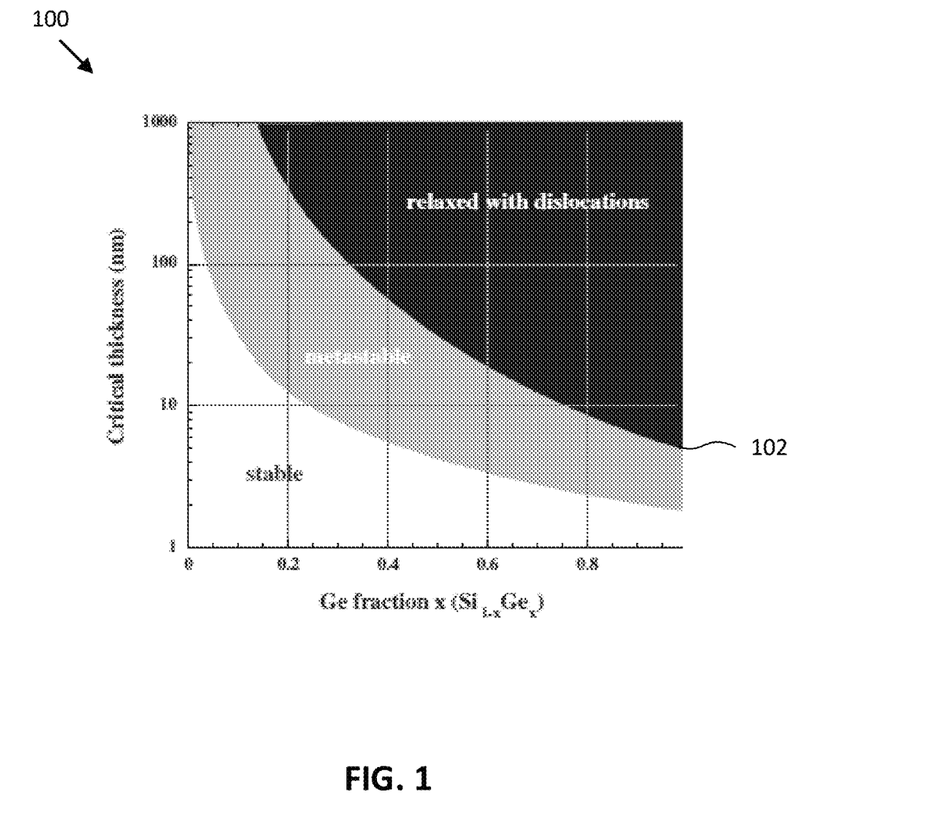
FIG. 1 is a graph of critical thickness versus germanium fraction, according to an embodiment.

FIG. 1 is a graph 100 of critical thickness versus germanium fraction, according to an embodiment. Regarding higher EPI defectivity, a SiGe layer can be formed on pure silicon epitaxially yielding a defect-free SiGe/Si stack, as long as the thickness of this layer is grown below the critical thickness hc. However, these hc values are significantly reduced with higher germanium content. For example, the kinetic limit hc of SiGe20 can be as high as 300 nm, as seen in FIG. 1 at the line 102 between the metastable and the relaxed with dislocation.

hc of SiGe50 in contrast sees about 10× reduction yielding a mere 30 nm. This implies that insertion of SiGey (e.g., SiGe50 to form stacked FETs (>30 nm)) will likely introduce EPI defects to impact device performances, such as leakage, in a significant manner.

Figure 2:
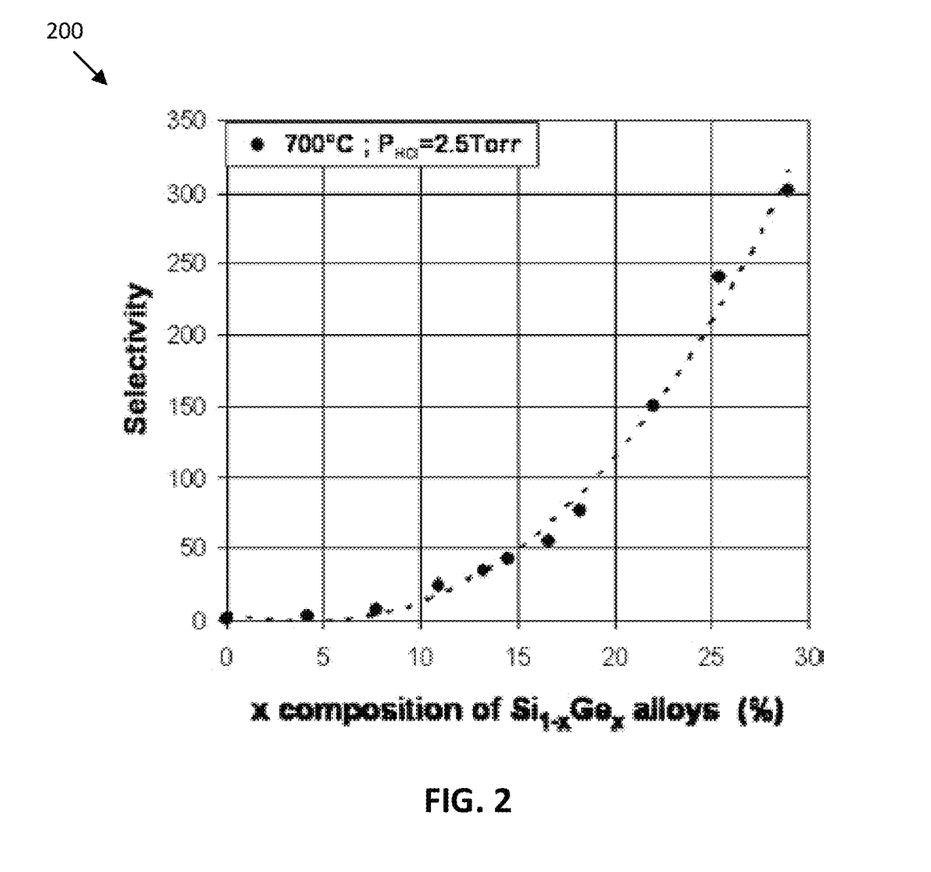
FIG. 2 is a graph showing selectivity versus composition, according to an embodiment.

FIG. 2 is a graph 200 showing selectivity versus composition, according to an embodiment. Regarding higher device variability due to loss of SiGex integrity, an ultrahigh selectivity ratio ($SR_{y-x}$) of SiGey vs. SiGex is highly desirable for the sacrificial SiGey removal. This is because the integrity of the dummy SiGex layer is needed for the subsequent RMG processes for the channel and device formation. It has been extensively studied that reasonably high SR values can be obtained from selective etching SiGex against pure Si. For example, $SR_{15-0}$ value, i.e., SiGe15 against Si, is quite large at 50 and $SR_{30-0}$ (SiGe30 against Si) is very large at 300, as shown in FIG. 2.

However, $SR_{30-15}$ (i.e., SiGe30 against SiGe15) has a low value of 6 with the same chemistry. This implies that the SiGex may not be able to maintain its integrity after the removal of a given SiGey. For example, edge portions of 10 nm thick SiGe15 layers (beneath and above a 10 nm sacrificial SiGe30 layer) may be significantly reduced or even removed to expose the channel region after the designated SiGe30 is removed. This can result in two impacts: (a) channel damage at edges and (b) non-uniform overall RMG thickness from the subsequent RMG processes. Both can negatively impact device performances from the resulted high variations of drive current $I_d$ and $V_t$.

These constraints (i.e., high EPI defects from easily violating the kinetic limit hc due to high Ge content of SiGey insertion and high negative impacts to downstream RMG processes from the corresponding low $SR_{y-x}$ values due to the loss of SiGex integrity) render isolation dielectrics (iso-D) formed from the Si/SiGex/Si . . . SiGex/SiGey/SiGex/Si/SiGex . . . /Si stack an unfavorable option.

There are additional constraints for a designated iso-D (i.e., it also needs to maintain high physical integrity from the subsequent the RMG formation processes (e.g., (a) against the dummy SiGex removal etch and (b) against HK preclean (e.g., HF solutions) applied before HK deposition)). In addition, there may be circumstances that additional selectivity against internal spacer (e.g., Si3N4) is required. Fortunately, many dielectrics can easily fulfill these requirements.

Figure 3:
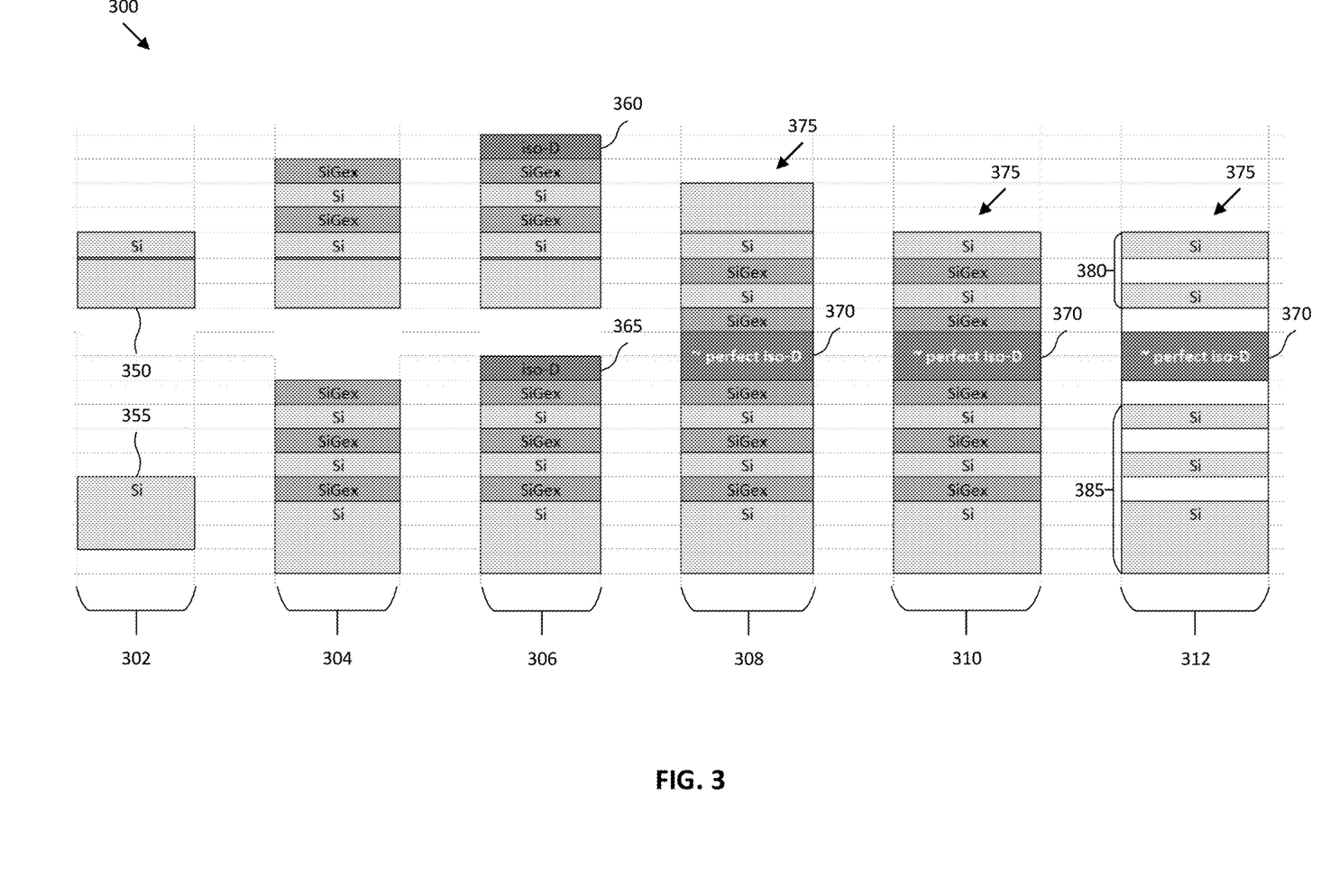
FIG. 3 is a diagram of a process of forming a stacked FET circuit, according to an embodiment.

FIG. 3 is a diagram 300 of a process of forming a stacked FET circuit, according to an embodiment. At 302, the process begins with a first top donor wafer 350 and a second bottom handler wafer 355. The top donor wafer 350 may be pretreated with the relevant hydrogen implanted (necessary to enable the subsequent Smart-Cut formation) and the second wafer 355 is the bottom handler Si wafer (a regular silicon wafer).

At 304, a relevant low temperature EPI growth of the designated SiGex/Si stack on individual wafers is performed, with germanium content x ranging from about 10% to about 35%, or from about 15% to about 30%. The relevant growth temperature may be less than 600° C. or less than 500° C. to avoid the activation of Smart-Cut prematurely.

At 306, relevant isolation dielectric layers 360 and 365, which are able to maintain physical integrity at the subsequent RMG processes, are formed on surfaces of the first wafer 350 and the second wafer 355. The dielectric layers 360 and 365 may be formed directly by using the corresponding low temperature atomic layer deposition. The relevant growth temperature may be less than 800° C. to avoid extensive germanium inter-diffusion into silicon or less than 500° C. to avoid the activation of Smart-Cut prematurely. Many dielectrics may be atomically deposited in the temperature range around 300° C.-400° C.

At 308, the donor wafer 350 is then bonded to the handler wafer 355 at the dielectric layer 360 and dielectric layer 365. The donor wafer 350 and the handler wafer 355 may be bonded using the standard silicon on insulator (SOI) process technology with an optimized anneal (at a temperature less than 700° C., or less than 500° C.) to avoid the activation of Smart-Cut prematurely and extensive germanium inter-diffusion into silicon to impact Si/SiGex interfacial integrity. This yields a near perfect single isolation dielectric layer 370 separating the top and bottom SiGex/Si stack 375.

At 310, a de-bonding anneal, together with a relevant chemical-mechanical polish (CMP) process, is applied to separate and to smooth the silicon from the donor wafer to form the desired stack 375. This de-bonding anneal may optimized to a temperature less than 1000° C., or less than 800° C. to avoid germanium inter-diffusion.

At 312, the intended nanosheet stacked FET configuration after the corresponding dummy layers are removed (e.g., at their designated RMG processes) is depicted. The top FET 380 is a silicon channel, and the bottom FET 385 is a silicon channel.

Figure 4:
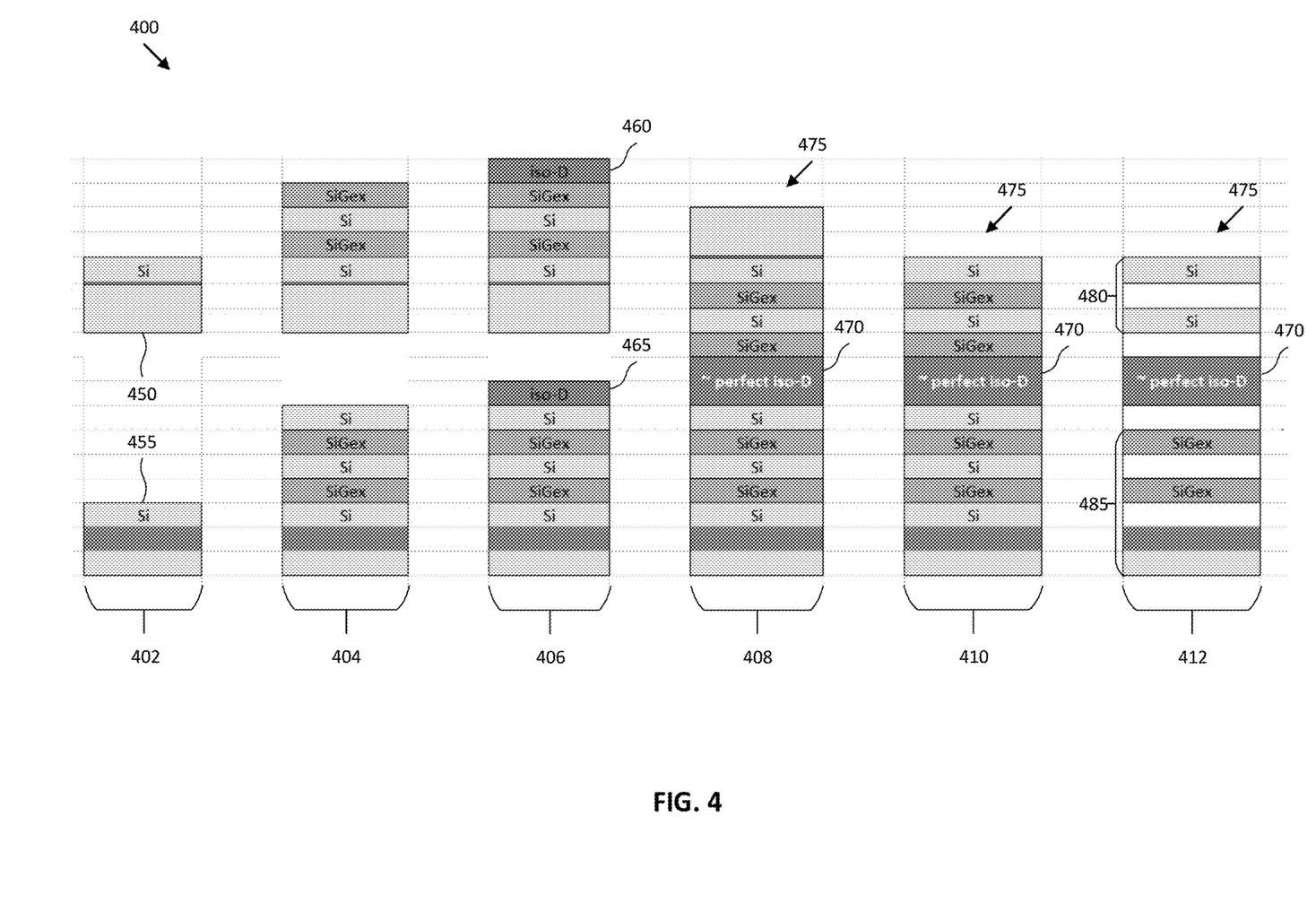
FIG. 4 is a diagram of a process of forming a stacked FET circuit, according to an embodiment.

FIG. 4 is a diagram 400 of a process of forming a dielectric on stacked FET, according to an embodiment. At 402, the process begins with a first top donor wafer 450 and a second bottom handler wafer 455. The Si layers of the bottom handler wafer 455 are designated sacrificial layers for the bottom FETs. In contrast, the SiGe layers of the top donor wafer 450 are designated sacrificial layers for the top FETs. In short, the stacked FETs formed in this manner display a Si (top) and SiGe channel (bottom) configuration. The top donor wafer 450 may be pretreated with the relevant hydrogen implant (necessary to enable the subsequent Smart-Cut formation) and the bottom handler wafer 455 is an SOI wafer.

At 404, a relevant low temperature EPI growth of the designated SiGex/Si stack on individual wafers is performed, with germanium content x ranging from about 10% to about 35%, or from about 15% to about 30%. The relevant growth temperature should be less than 600° C. or more specifically less than 500° C. to avoid the activation of Smart-Cut prematurely.

At 406, relevant isolation dielectric layers 460 and 465, which are able to maintain physical integrity at the subsequent RMG processes, are formed on surfaces of the first wafer 450 and the second wafer 455. The dielectric layers 460 and 465 may be formed directly by using the corresponding low temperature atomic layer deposition. The relevant growth temperature may be less than 800° C. to avoid extensive germanium inter-diffusion into silicon or less than 500° C. to avoid the activation of Smart-Cut prematurely. Many dielectrics may be atomically deposited in the temperature range around 300° C.-400° C.

At 408, the donor wafer 450 is bonded to the handler wafer 455 at the dielectric layer 460 and the dielectric layer 465. The donor wafer 450 and the handler wafer 455 may be bonded using the standard SOI process technology with an optimized anneal (at a temperature less than 700° C., or less than 500° C.) to avoid extensive germanium inter-diffusion into silicon and the activation of Smart-Cut prematurely. This yields a near perfect single isolation dielectric layer 470 separating the top and bottom SiGex/Si stack 475.

At 410 a de-bonding anneal, together with a relevant CMP process, is applied to separate and to smooth the silicon from the donor wafer to form the desired stack 475. This de-bonding anneal may optimized to a temperature less than 1000° C., or less than 800° C. to avoid germanium inter-diffusion.

At 412, the intended nanosheet stacked FET configuration after the corresponding dummy layers are removed (e.g., at their designated RMG processes) is depicted. The top FET 480 is a silicon channel, and the bottom FET 485 is an Si/Ge channel.

Figure 5:
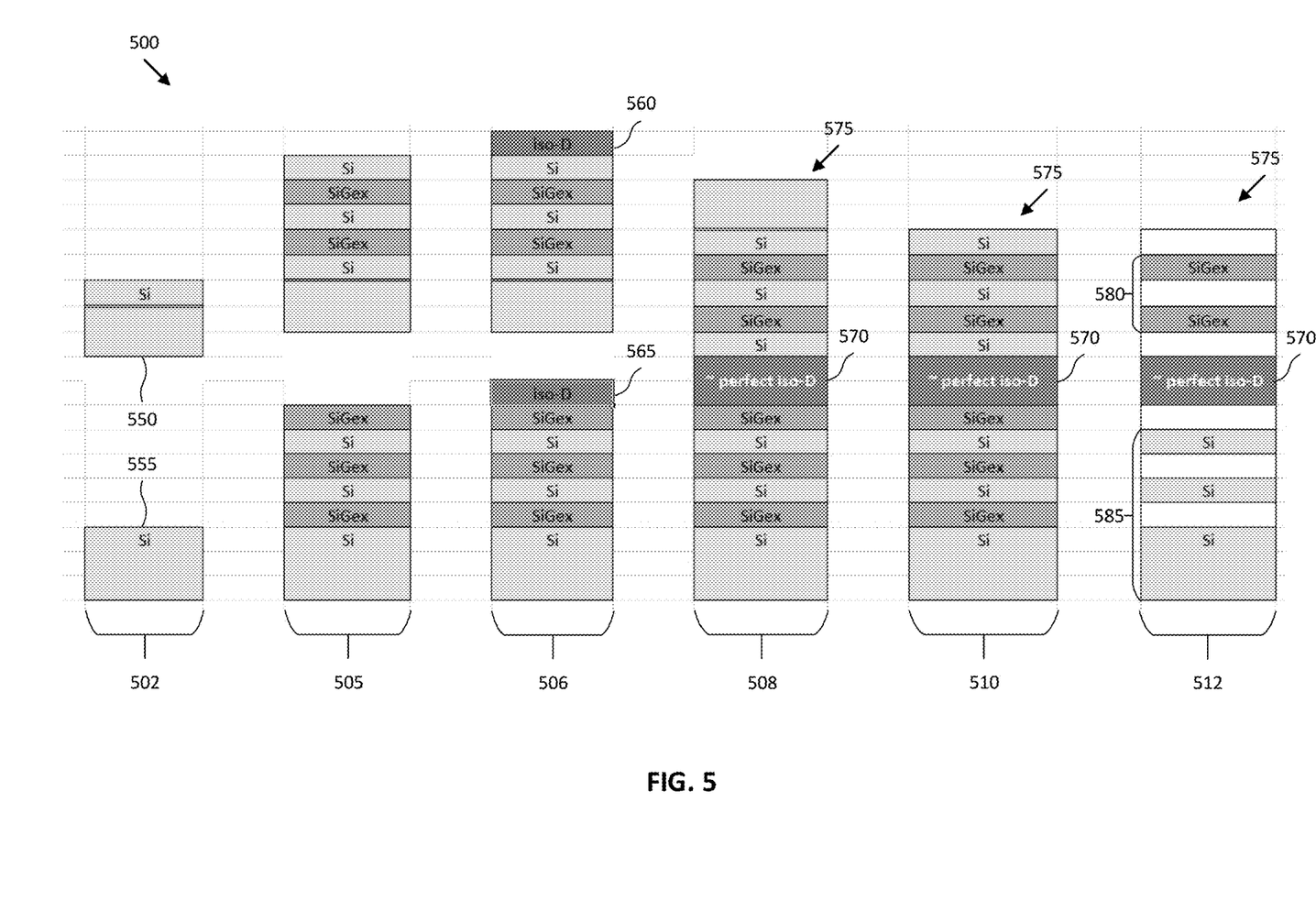
FIG. 5 is a diagram of a process of forming a stacked FET circuit, according to an embodiment.

FIG. 5 is a diagram 500 of a process of forming a dielectric on stacked FET, according to an embodiment. At 502, the process begins with a first top donor wafer 550 and a second bottom handler wafer 555. The SiGe layers of the bottom handler wafer 555 are designated sacrificial layers for the bottom FETs. In contrast, the Si layers of the top donor wafer 550 are designated sacrificial layers for the top FETs. In short, the stacked FETs formed in this manner display a SiGe (top) and Si channel (bottom) configuration. The top donor wafer 550 is pretreated with the relevant hydrogen implanted (necessary to enable the subsequent Smart-Cut formation) and the bottom handler wafer 555 is a silicon wafer.

At 504, a relevant low temperature EPI growth of the designated SiGex/Si stack on individual wafers is performed, with germanium content x ranging from about 10% to about 35%, or from about 15% to about 30%. The relevant growth temperature should be less than 600° C. or more specifically less than 500° C. to avoid the activation of Smart-Cut prematurely.

At 506, relevant isolation dielectric layers 560 and 565, which are able to maintain physical integrity at the subsequent RMG processes, are formed on surfaces of the first wafer 550 and the second wafer 555. The dielectric layers 560 and 565 may be formed directly by using the corresponding low temperature atomic layer deposition. The relevant growth temperature may be less than 800° C. to avoid extensive germanium inter-diffusion into silicon or less than 500° C. to avoid the activation of Smart-Cut prematurely. Many dielectrics may be atomically deposited in the temperature range around 300° C.-400° C.

At 508, the donor wafer 550 is then bonded to the handler wafer 555 at the dielectric layer 560 and the dielectric layer 565. The donor wafer 550 and the handler wafer 555 may be bonded using the standard SOI process technology with an optimized anneal less than 800° C. to avoid extensive germanium inter-diffusion into silicon to impact Si/SiGex interfacial integrity or less than 500° C. to avoid the activation of Smart-Cut prematurely. This yields a near perfect single isolation dielectric layer 570 separating the top and bottom SiGex/Si stack 575.

At 510, a de-bonding anneal, together with a relevant CMP process, is applied to separate and to smooth the silicon from the donor wafer to form the desired stack 575. This de-bonding anneal may optimized to a temperature less than 1000° C., or less than 800° C. to avoid germanium inter-diffusion.

At 512, the intended nanosheet stacked FET configuration after the corresponding dummy layers are removed (e.g., at their designated RMG processes) is depicted. The top FET 580 is an Si/Ge channel, and the bottom FET 585 is a silicon channel.

Figure 6:
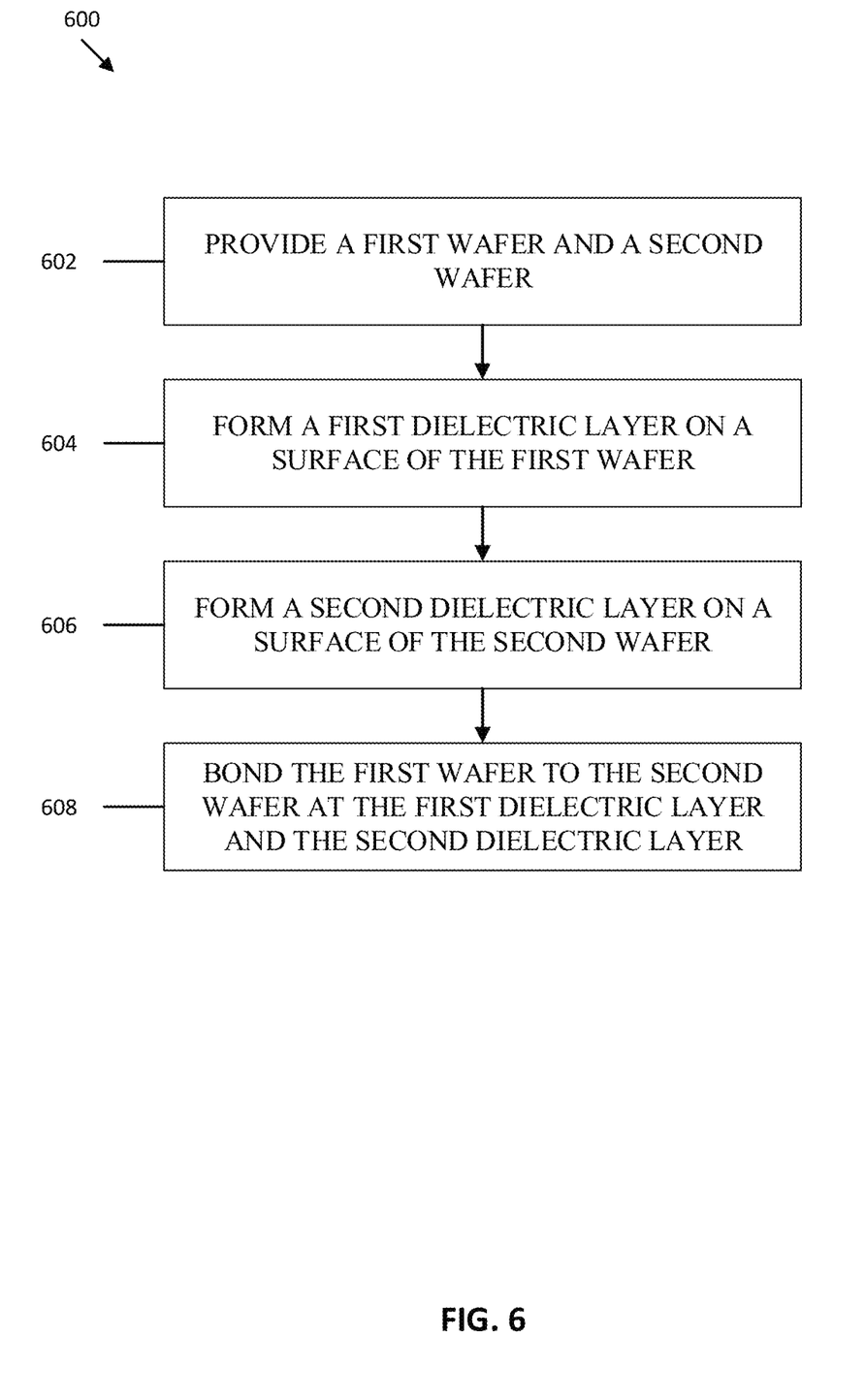
FIG. 6 is a flowchart of a method of forming a stacked FET circuit, according to an embodiment.

FIG. 6 is a flowchart 600 of a method of forming a stacked FET circuit, according to an embodiment. At 602, a first wafer and a second wafer are provided. The starting wafers for forming the designated nanosheet stacked FET circuit include two wafers (i.e., a donor and a handler wafer). These two wafers may be optimized to have different flavors. For example, the donor wafer may be a silicon wafer pretreated a relevant hydrogen implant (to enable the subsequent debonding processes). Subsequently, a designated Si/SiGex nanosheets structure is formed on top with standard EPI processes. The handler wafer may be a regular silicon wafer (or an SOI wafer) with designated Si/SiGex nanosheets structure formed on top with standard EPI processes.

The Si/SiGex nanosheets structure created on each of the two wafers is a horizontal, periodic (parallel) structure with the thickness and spacing of each of the nanosheets tuned independently by the corresponding EPI processes. The germanium concentration x may be in the range of about 5% to about 40%, or about 15% to about 30%. The thickness of Si and SiGex may from about 3 nm to about 20 nm, or about 5 nm to about 10 nm.

At 604, a first dielectric layer is formed on a surface of the first wafer. The first dielectric layer may be formed on a top surface of the first wafer. At 606, a second dielectric layer is formed on a surface of the second wafer. The second dielectric layer may be formed on a top surface of the second wafer.

Various dielectrics, in addition to SiO2, may be applied to form the desired isolation dielectrics as long as they can form strong bonding during the corresponding bonding processes and can withstand the subsequent RMG process steps such as HK pre-clean. Additionally, these dielectrics should be formed in a temperature range in an atomically deposited manner without activating the Smart-Cut prematurely. Dielectrics meeting these criteria include common nitrides such as Si3N4 and AlN, carbides such as SiC, various HK oxides such as HfO2, ZrO2, Al2O3, and BeO, etc., and mixed dielectrics such as HfZrO, HfAlO, HfSiO, SiOC, SiOCN, SiBCN, etc.

Isolation dielectrics formed in this manner, benefiting directly from applying the standard SOI and SiGeOI process technology, are naturally defect-free. In addition, the overall physical integrity of the dummy layer (SiGex or Si), crucial for the subsequent RMG processes, is also maintained in a near perfect manner.

At 608, the first wafer and the second wafer are bonded at the first dielectric layer and the second dielectric layer. The first wafer and second wafer may be bonded by disposing the first wafer on top of the second wafer at the surfaces of the respective dielectric layers. The bonding may result in the first dielectric layer and the second dielectric layer forming a single dielectric layer. The total thickness of the isolation dielectrics formed through the bonding of two wafers and can be tuned independently from the Si/SiGe stacks beneath and above. The resulting thickness may be in the range of about 5 nm to about 50 nm, or about 5 nm to about 20 nm.

The arrangement of Si/SiGe stacks may be tuned separately for forming the designated nanosheet stacked FETs (i.e., to result in a Si on Si, SiGe on Si or Si on SiGe, or even SiGe on SiGe final structure) based upon the individual dummy layers chosen for the designated top and bottom devices. The crystal orientation of each wafer may also be independently chosen by varying the starting wafer with the designated orientation, if desired. This is because the bonding of two wafers is independent of the crystal orientation.

Different channel materials may also be integrated heterogeneously such as strained or unstrained Si, Ge, SiGe, InGaAs, GaAs, etc., by modifying the starting wafers with the designated channel materials since the bonding force (van-der-Waal forces) for forming isolation dielectrics is material-independent.

The bonding and debonding steps described above may be optimized to avoid the germanium inter-diffusion into silicon and the activation of Smart-Cut prematurely. This can protect the integrity of the Si/SiGex stacks, which is crucial for the subsequent RMG and device performance. Anneals for bonding and debonding of these designated wafers may be less than 700 C, or less than 500 C. A lower temperature may be needed should the channel materials are different than Si or SiGe (e.g., III-V and pure Ge).

The donor wafer may be implanted with an implant typically used in the SOI technology (such as H2 implant in SMARTCUT) with a depth deeper than the subsequent nanosheet requirements (e.g., about 10 nm to about 20 nm) comprehending to the future expected loss of silicon thickness due to a later CMP process needed for smoothing the surface.

The thickness of individual layer inside each of the Si/SiGe stacks may be tuned independently to meet the final requirement of the unipolar stacked FETs. It may be desirable to limit the total thickness of the Si/SiGe stacks to be less than the critical thickness hc (kinetic limits) to avoid generating any EPI defect.

The total number of nanosheets may be greater than two as long as the relevant bonding/debonding/CMP steps can meet the final unipolar stacked FET requirements.

Figure 7:
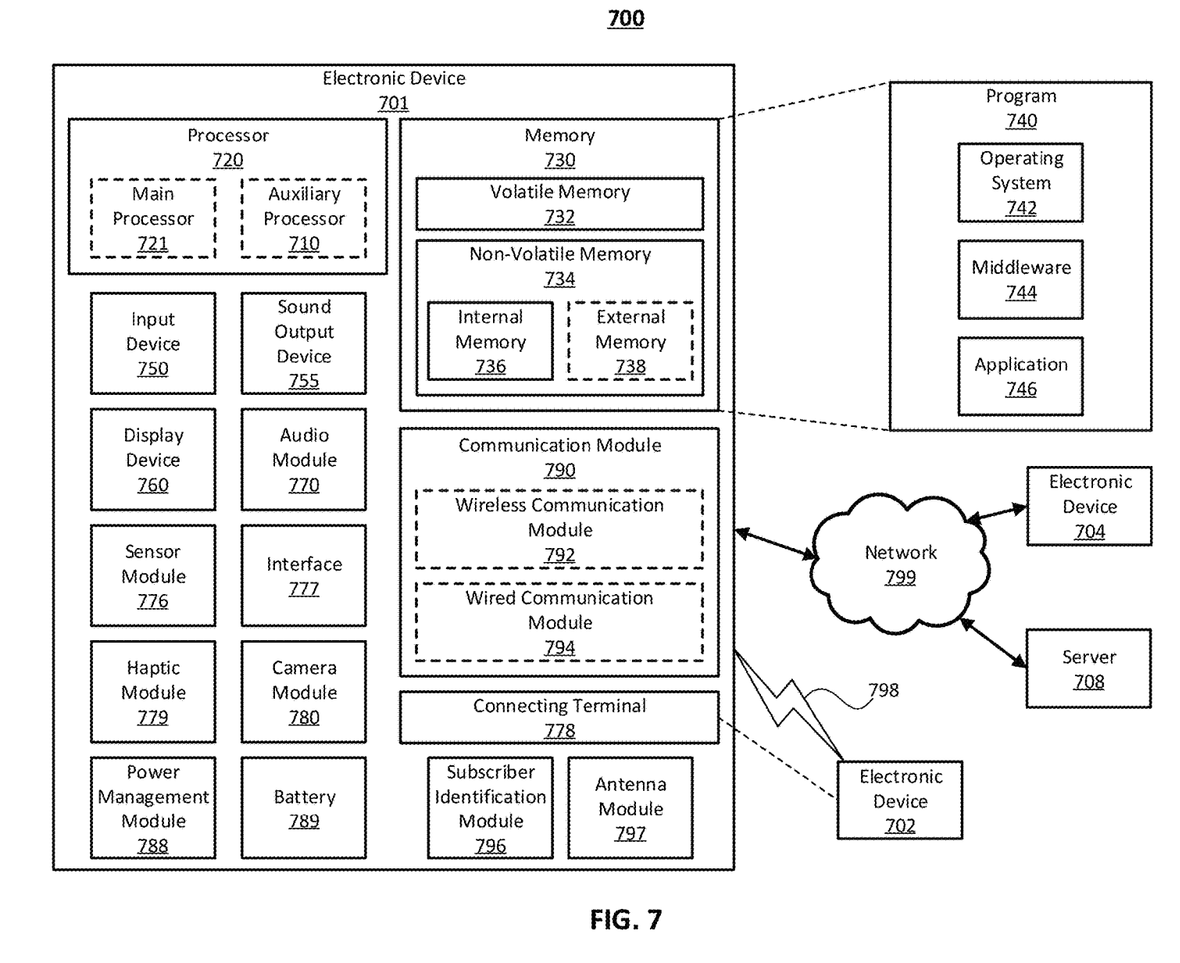
FIG. 7 is a block diagram of an electronic device in a network environment, according to one embodiment.

FIG. 7 is a block diagram of an electronic device 701 in a network environment 700, according to one embodiment.

Referring to FIG. 7, the electronic device 701 in the network environment 700 may communicate with an electronic device 702 via a first network 798 (e.g., a short-range wireless communication network), or an electronic device 704 or a server 708 via a second network 799 (e.g., a long-range wireless communication network). The electronic device 701 may communicate with the electronic device 704 via the server 708. The electronic device 701 may include a processor 720, a memory 730, an input device 750, a sound output device 755, a display device 760, an audio module 770, a sensor module 776, an interface 777, a haptic module 779, a camera module 780, a power management module 788, a battery 789, a communication module 790, a subscriber identification module (SIM) 796, or an antenna module 797. In one embodiment, at least one (e.g., the display device 760 or the camera module 780) of the components may be omitted from the electronic device 701, or one or more other components may be added to the electronic device 701. In one embodiment, some of the components may be implemented as a single integrated circuit (IC). For example, the sensor module 776 (e.g., a fingerprint sensor, an iris sensor, or an illuminance sensor) may be embedded in the display device 760 (e.g., a display).

The processor 720 may execute, for example, software (e.g., a program 740) to control at least one other component (e.g., a hardware or a software component) of the electronic device 701 coupled with the processor 720, and may perform various data processing or computations. As at least part of the data processing or computations, the processor 720 may load a command or data received from another component (e.g., the sensor module 776 or the communication module 790) in volatile memory 732, process the command or the data stored in the volatile memory 732, and store resulting data in non-volatile memory 734. The processor 720 may include a main processor 721 (e.g., a central processing unit (CPU) or an application processor (AP)), and an auxiliary processor 723 (e.g., a graphics processing unit (GPU), an image signal processor (ISP), a sensor hub processor, or a communication processor (CP)) that is operable independently from, or in conjunction with, the main processor 721. Additionally or alternatively, the auxiliary processor 723 may be adapted to consume less power than the main processor 721, or execute a particular function. The auxiliary processor 723 may be implemented as being separate from, or a part of, the main processor 721.

The auxiliary processor 723 may control at least some of the functions or states related to at least one component (e.g., the display device 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). According to one embodiment, the auxiliary processor 723 (e.g., an image signal processor or a communication processor) may be implemented as part of another component (e.g., the camera module 780 or the communication module 790) functionally related to the auxiliary processor 723.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input device 750 may receive a command or data to be used by other component (e.g., the processor 720) of the electronic device 701, from the outside (e.g., a user) of the electronic device 701. The input device 750 may include, for example, a microphone, a mouse, or a keyboard.

The sound output device 755 may output sound signals to the outside of the electronic device 701. The sound output device 755 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 760 may visually provide information to the outside (e.g., a user) of the electronic device 701. The display device 760 may include, for example, a display, a hologram device, or a projector and control circuitry to control a corresponding one of the display, hologram device, and projector. According to one embodiment, the display device 760 may include touch circuitry adapted to detect a touch, or sensor circuitry (e.g., a pressure sensor) adapted to measure the intensity of force incurred by the touch.

The audio module 770 may convert a sound into an electrical signal and vice versa. According to one embodiment, the audio module 770 may obtain the sound via the input device 750, or output the sound via the sound output device 755 or a headphone of an external electronic device 702 directly (e.g., wired) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. The sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled with the external electronic device 702 directly (e.g., wired) or wirelessly. According to one embodiment, the interface 777 may include, for example, a high definition multimedia interface (HDMI), a universal serial bus (USB) interface, a secure digital (SD) card interface, or an audio interface.

A connecting terminal 778 may include a connector via which the electronic device 701 may be physically connected with the external electronic device 702. According to one embodiment, the connecting terminal 778 may include, for example, an HDMI connector, a USB connector, an SD card connector, or an audio connector (e.g., a headphone connector).

The haptic module 779 may convert an electrical signal into a mechanical stimulus (e.g., a vibration or a movement) or an electrical stimulus which may be recognized by a user via tactile sensation or kinesthetic sensation. According to one embodiment, the haptic module 779 may include, for example, a motor, a piezoelectric element, or an electrical stimulator.

The camera module 780 may capture a still image or moving images. According to one embodiment, the camera module 780 may include one or more lenses, image sensors, image signal processors, or flashes.

The power management module 788 may manage power supplied to the electronic device 701. The power management module 788 may be implemented as at least part of, for example, a power management integrated circuit (PMIC).

The battery 789 may supply power to at least one component of the electronic device 701. According to one embodiment, the battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the AP) and supports a direct (e.g., wired) communication or a wireless communication. According to one embodiment, the communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct, or a standard of the Infrared Data Association (IrDA)) or the second network 799 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The antenna module 797 may transmit or receive a signal or power to or from the outside (e.g., the external electronic device) of the electronic device 701. According to one embodiment, the antenna module 797 may include one or more antennas, and, therefrom, at least one antenna appropriate for a communication scheme used in the communication network, such as the first network 798 or the second network 799, may be selected, for example, by the communication module 790 (e.g., the wireless communication module 792). The signal or the power may then be transmitted or received between the communication module 790 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 701 and the external electronic device 704 via the server 708 coupled with the second network 799. Each of the electronic devices 702 and 704 may be a device of a same type as, or a different type, from the electronic device 701. All or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, or client-server computing technology may be used, for example.

One embodiment may be implemented as software (e.g., the program 740) including one or more instructions that are stored in a storage medium (e.g., internal memory 736 or external memory 738) that is readable by a machine (e.g., the electronic device 701). For example, a processor of the electronic device 701 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A stacked field effect transistor (FET) circuit, comprising:
   a first wafer including a first silicon-based layer, a second silicon-based layer, a first dielectric layer that is formed on a surface of the first wafer, and an empty gap that extends from the first dielectric layer to the second silicon-based layer; and
   a second wafer including multiple silicon-based layers, and a second dielectric layer that is formed on a surface of the second wafer and that is isolated from each of the multiple silicon-based layers of the second wafer,
   wherein the first wafer and the second wafer are bonded at the first dielectric layer and the second dielectric layer.

2. The circuit of claim 1, wherein a low temperature epitaxial (EPI) growth is performed on the first wafer and the second wafer before the first wafer and the second wafer are bonded.

3. The circuit of claim 1, wherein a de-bonding anneal with a chemical-mechanical polish (CMP) process is applied after the first wafer is bonded to the second layer.

4. The circuit of claim 1, wherein the first dielectric layer or the second dielectric layer is at least one of $Si_3N_4$, SiCN, $HfO_2$ or $Al_2O_3$.

5. The circuit of claim 1, wherein the second wafer is a handler silicon on insulator (SOI) wafer.

6. The circuit of claim 1, wherein the stacked FET circuit is a configuration of two FETs.

7. The circuit of claim 6, wherein the configuration of two FETs comprises a top silicon channel and a bottom silicon channel.

8. The circuit of claim 6, wherein the configuration of two FETs comprises a top silicon channel and a bottom Si/Ge channel.

9. The circuit of claim 6, wherein the configuration of two FETs comprises a top Si/Ge channel and a bottom silicon channel.

10. The circuit of claim 6, wherein the configuration of two FETs comprises a top channel and a bottom channel, and one or both of the top channel and the bottom channel is a Ge channel.

11. The circuit of claim 1, wherein a total thickness of the first dielectric layer and the second dielectric layer after bonding if about 5 nm to about 20 nm.

12. The circuit of claim 1, wherein the first dielectric layer or the second dielectric layer comprises $SiO_2$.

13. The circuit of claim 1, wherein the first wafer or the second wafer comprise Ge.

14. The circuit of claim 1, wherein the first dielectric layer and the second dielectric layer form an isolated dielectric layer that is isolated from each of the first and second silicon-based layers of the first wafer and each of the multiple silicon-based layers of the second wafer.

* * * * *